United States Patent
Masuda et al.

(10) Patent No.: US 9,321,263 B2
(45) Date of Patent: Apr. 26, 2016

(54) ELECTROMECHANICAL TRANSDUCER, LIQUID DROPLET DISCHARGE HEAD, AND IMAGE FORMING APPARATUS

(71) Applicants: Toshiaki Masuda, Kanagawa (JP); Keishi Miwa, Kanagawa (JP)

(72) Inventors: Toshiaki Masuda, Kanagawa (JP); Keishi Miwa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/748,517

(22) Filed: Jun. 24, 2015

(65) Prior Publication Data

US 2016/0001556 A1  Jan. 7, 2016

(30) Foreign Application Priority Data

Jul. 2, 2014  (JP) .................................. 2014-136980

(51) Int. Cl.
  *B41J 2/045* (2006.01)
  *B41J 2/14* (2006.01)
  *H01L 41/047* (2006.01)

(52) U.S. Cl.
  CPC ........... *B41J 2/14201* (2013.01); *H01L 41/047* (2013.01)

(58) Field of Classification Search
  CPC .... B41J 2/14201; B41J 2/14233; B41J 2/161; B41J 2/1631; B41J 2/1642; B41J 2/1643; B41J 2/1645
  See application file for complete search history.

(56) References Cited

U.S. PATENT DOCUMENTS

| 7,481,519 B2 * | 1/2009 | Shimada | B41J 2/14233 347/70 |
| 8,371,681 B2 * | 2/2013 | Miyazawa | B41J 2/14233 347/68 |

FOREIGN PATENT DOCUMENTS

| JP | 2000-150825 | 5/2000 |
| JP | 2000-269443 | 9/2000 |
| JP | 2004-253334 | 9/2004 |
| JP | 2006-254295 | 9/2006 |
| JP | 2009-015288 | 1/2009 |
| JP | 2013-000992 | 1/2013 |

* cited by examiner

*Primary Examiner* — Juanita D Jackson (74) *Attorney, Agent, or Firm* — Cooper & Dunham LLP (57) ABSTRACT

An electromechanical transducer includes a substrate; a diaphragm formed on the substrate; and a piezoelectric element that includes a lower electrode; a piezoelectric member; and an upper electrode, in which a lower electrode film to form the lower electrode, a piezoelectric film to form the piezoelectric member, and an upper electrode film to form the upper electrode are laminated in layers on the diaphragm formed on the substrate. The piezoelectric element is formed such that the lower electrode film, the piezoelectric member film, and the upper electrode film are patterned to form the lower electrode, the piezoelectric member, and the upper electrode, each of which has a desired pattern; and corners of the lower electrode are rounded.

16 Claims, 8 Drawing Sheets

PRIOR ART

ELECTROMECHANICAL TRANSDUCER, LIQUID DROPLET DISCHARGE HEAD, AND IMAGE FORMING APPARATUS

CROSS-REFERENCE TO RELATED APPLICATION

The present application claims priority pursuant to 35 U.S.C. §119(a) from Japanese patent application number 2014-136980, filed on Jul. 2, 2014, the entire disclosure of which is incorporated by reference herein.

BACKGROUND

1. Technical Field

Exemplary embodiments of the present invention relate to an electromechanical transducer element, a liquid droplet discharge head to discharge liquid droplets using the electromechanical transducer, and an image forming apparatus including the liquid droplet discharge head.

2. Background Art

As an image forming apparatus, an inkjet recording apparatus including an ink droplet discharge head to discharge ink droplets to form images on a medium, such as a sheet of paper, while conveying the medium by adhering the ink droplets thereon is known.

The liquid droplet discharge head includes nozzles to discharge liquid droplets of a liquid such as ink; a liquid chamber (which may be denoted as a pressure chamber, a discharge chamber, and the like) to communicate with the nozzles and containing a liquid; and an electromechanical transducer such as a piezoelectric element. The piezoelectric element (to which a drive voltage is applied) included in the liquid droplet discharge head vibrates to deform a diaphragm that forms one wall of the liquid chamber, so that the deformation of the diaphragm squeezes the liquid inside the liquid chamber, thereby enabling to discharge liquid droplets from the nozzles.

The liquid droplet discharge head employs a piezoelectric actuator that employs a bending vibration mode and has a construction in which the piezoelectric element, including a lower electrode, a piezoelectric member, and an upper electrode laminated one atop the other, is disposed on the diaphragm.

As a method of manufacturing the liquid droplet discharge head, a semiconductor device production technology adapting the Micro-electromechanical System (hereinafter, MEMS) is used. The production method using MEMS includes forming a diaphragm on one side of a substrate that forms a partition wall of the liquid chamber. On the diaphragm, a lower electrode film to form the lower electrode, a piezoelectric member film to form the piezoelectric member, and an upper electrode film to form the upper electrode are sequentially formed. Each film is subjected to resist pattern formation by photolithography, etching, and resist separation using a chemical liquid to form a piezoelectric element including the lower electrode, piezoelectric member, and upper electrode each layer laminated in layers with a predetermined pattern. With this structure, a piezoelectric actuator substrate as an electromechanical transducer with a plurality of piezoelectric elements each formed in a predetermined pattern can be obtained.

SUMMARY

In one embodiment of the disclosure, there is provided an optimal electromechanical transducer including a substrate; a diaphragm formed on the substrate; and a piezoelectric element that includes a lower electrode; a piezoelectric member; and an upper electrode, in which a lower electrode film to form the lower electrode, a piezoelectric film to form the piezoelectric member, and an upper electrode film to form the upper electrode are laminated in layers on the diaphragm formed on the substrate; the piezoelectric element is formed such that the lower electrode film, the piezoelectric member film, and the upper electrode film are patterned to form the lower electrode, the piezoelectric member, and the upper electrode, each of which has a desired pattern; and corners of the lower electrode are rounded.

In another embodiment of the disclosure, there is provided a liquid droplet discharge head including a plurality of nozzles to discharge liquid droplets; liquid chambers each to contain a liquid, and communicating to the plurality of nozzles; and an electromechanical transducer, including a piezoelectric element, disposed on a substrate to form the liquid chambers, to squeeze the liquid inside the liquid chambers, in which the electromechanical transducer as described above is employed.

In another and further embodiment of the disclosure, there is provided an image forming apparatus including a liquid droplet discharge head as described above, to discharge liquid droplets to thereby form an image.

These and other objects, features, and advantages of the present invention will become apparent upon consideration of the following description of the preferred embodiments of the present invention when taken in conjunction with the accompanying drawings.

DETAILED DESCRIPTION

Hereinafter, a preferred embodiment of the present invention will be described with reference to accompanying drawings.

Figure 1:
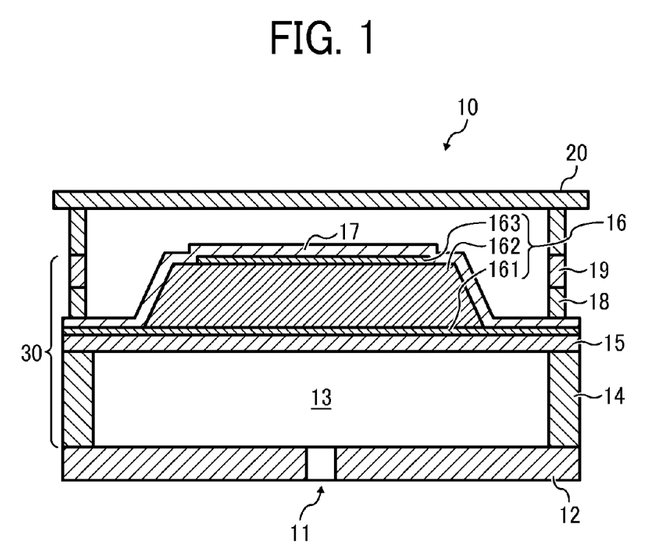
FIG. 1 is a schematic cross-sectional view of a liquid droplet discharge section as a basic structure of a liquid droplet discharge head, along an alignment direction of a liquid chamber according to an embodiment of the present invention.
Figure 2:
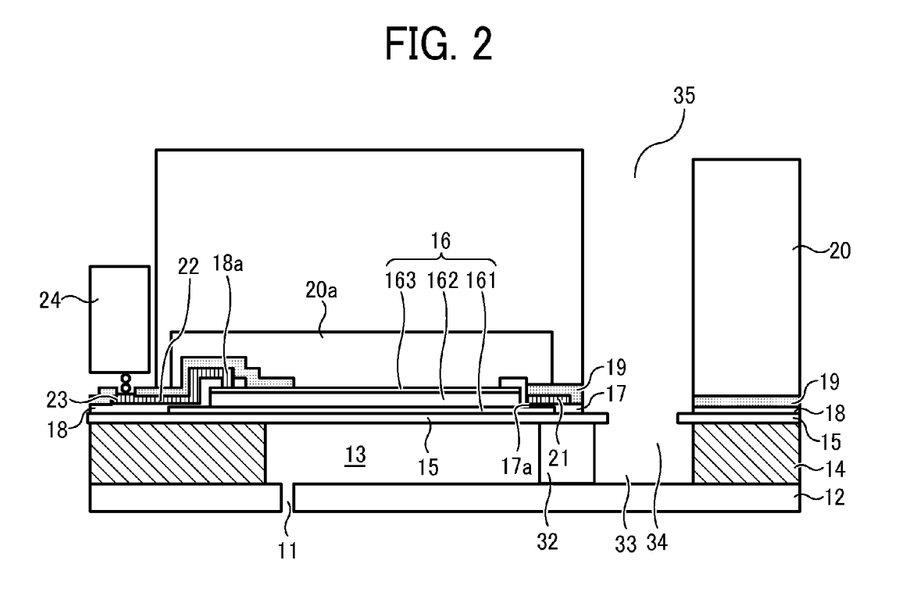
FIG. 2 is a schematic cross-sectional view of the liquid droplet discharge section as a basic structure of a liquid droplet discharge head, along a direction perpendicular to the alignment direction of the liquid chamber according to an embodiment of the present invention.

FIG. 1 is a schematic cross-sectional view of a liquid discharge section as a basic structure of a liquid droplet discharge head along an alignment direction of a liquid chamber. For simplification, part corresponding to one liquid chamber alone is illustrated. In addition, FIG. 2 is a cross-sectional view of the liquid discharge section along a direction perpendicular to the alignment direction of the liquid chamber.

As illustrated in FIG. 1, the liquid droplet discharge section 10 includes a nozzle substrate 12 that includes a nozzle 11 to discharge liquid droplets such as ink and a liquid chamber substrate 14 (hereinafter, simply referred to as a substrate 14) on which a liquid chamber 13 that communicates to the nozzle 11 and accommodates the liquid is formed. Partition walls of the liquid chamber 13 communicating to the nozzle 11, a fluid resistor 32, an ink inlet 33 to the liquid chamber 13 are formed on the substrate 14. A diaphragm 15 serving as a wall of the liquid chamber 13 is formed on the substrate 14, and a piezoelectric element 16 formed of a lower electrode 161, a piezoelectric member 162 formed of lead zirconate titanate (PZT), and an upper electrode 163 is disposed on the diaphragm 15. A first insulation protective film 17 serving as a first protective film, a second insulation protective film 18, a third insulation protective film 19, and a sub frame 20 are so disposed as to cover the piezoelectric element 16.

The piezoelectric element 16 includes the lower electrode 161 as a common electrode on the side of the diaphragm 15, the piezoelectric member 162 formed of the piezoelectric transducer film such as PZT, and the upper electrode 163 disposed on a side opposite the diaphragm 15 and serving as an individual electrode, which are disposed in layers. The lower electrode 161 is connected to a wire 21 via a contact hole 17a formed in the first insulation protective film 17, and is connected, via the wire 21, to a pad electrode for the common electrode that serves as a terminal electrode for external connection. The upper electrode 163 is connected to a wire 22 via a contact hole 18a formed in the second insulation protective film 18, and is connected, via the wire 22, to a pad electrode 23 for the individual electrode as a terminal electrode for external connection.

The sub frame 20 provides a protective space 20a of the piezoelectric element 16 including the wire 21 for the common electrode electrically connected to the lower electrode 161 and the upper electrode 163 and the wire 22 for the individual electrode; and a space for disposing a driver IC 24. In addition, the sub frame 20 includes a groove serving as an ink channel 35 from a common liquid chamber to the liquid chamber 13. The ink channel 35 communicates the ink inlet 33 formed on the substrate 14 via an ink supply port 34.

In the thus-configured liquid droplet discharge section 10, via the pad electrode for the common electrode and the wire 21, and via the pad electrode 23 for the individual electrode and the wire 22, a drive voltage with a predetermined frequency and amplitude is applied to a portion between the lower electrode 161 and the upper electrode 163 of the piezoelectric element 16, respectively. The piezoelectric element 16 to which the drive voltage is applied vibrates to deform the diaphragm 15 disposed between the substrate 14 and the piezoelectric element 16 and the liquid inside the liquid chamber 13 is pressurized due to the deformation of the diaphragm 15, so that a liquid droplet is discharged from the nozzle 11.

Next, materials and methods of producing each part and component that construct the liquid droplet discharge head will be described in detail.

<Substrate>

An example of the preferred material for the substrate 14 includes single-crystal silicon, which is formed to have a depth normally ranging from 100 [μm] to 600 [μm]. There are three types of plane directions for the single-crystal silicon, (100), (110), and (111). In general, (100) and (111) are widely used in the semiconductor industry. In the present embodiment, a single-crystal substrate having the plane direction (100) is mainly used. In addition, when the liquid chamber or the pressure chamber 13 as illustrated in FIG. 1 is produced, the single-crystal silicon substrate is processed using etching. In this case, anisotropic etching is generally used, and is performed using a different etching speed relative to the plane direction of the crystal structure. Specifically, in the anisotropic etching performed by soaking the single-crystal silicon into an alkali solution such as potassium hydrate (KOH), the etching speed of the (111) plane becomes approximately one four-hundredth of the etching speed of the (100) plane. Accordingly, although a structure having an inclination of approximately 54 degrees can be formed with the plane direction (100), because a deep groove can be etched with the plane direction (111) a higher array density can be obtained while maintaining good mechanical rigidity. Alternatively, the single-crystal substrate with the plane direction (110) can also be used. In this case, however, there are other factors to be considered because silicon dioxide ($SiO_2$) as a mask material is also etched.

<Diaphragm>

As illustrated in FIG. 1, the piezoelectric element 16 as the electromechanical transducer element generates pressure, and the diaphragm 15 disposed below the piezoelectric element 16 deforms, thereby causing the liquid droplet such as ink in the liquid chamber or the pressure chamber 13 to be discharged. Accordingly, it is preferred that the diaphragm 15 have a predetermined rigidity. Therefore, preferred materials for the diaphragm 15 include Si, $SiO_2$, and $Si_3N_4$ formed by chemical vapor deposition (CVD). Further, materials with a linear expansion coefficient which is nearer to that of the common electrode or the lower electrode 161 and of the piezoelectric member 162 are preferably selected. In particular, the piezoelectric member 162 is in general made of PZT. Accordingly, the materials of the diaphragm 15 preferably have a linear expansion coefficient ranging from $5×10^{-6}(1/K)$ to $10×10^{-6}(1/K)$, which approximates the linear expansion coefficient $8×10^{-6}(1/K)$ of PZT. Furthermore, materials with the linear expansion coefficient ranging from $7×10^{-6}(1/K)$ to $9×10^{-6}(1/K)$ are more preferable. More specifically, aluminum oxide, zirconium oxide, iridium oxide, ruthenium oxide, tantalum oxide, hafnium oxide, osmium oxide, rhenium oxide, rhodium oxide, palladium oxide, and chemical compounds thereof, are used. These materials are processed with a spin coater using sputtering or sol-gel method. The thickness of the diaphragm 15 is preferably from 0.1 [μm] to 10 [μm], and more preferably, from 0.5 [μm] to 3 [μm]. If the thickness is less than 0.1 [μm], processing of the liquid chamber or the pressure chamber 13 as illustrated in FIG. 1 becomes difficult. If the thickness is more than 10 [μm], the diaphragm 15 hardly deforms, and discharging of the liquid droplet such as ink droplet becomes unstable.

<Lower Electrode (Common Electrode)>

Figure 1A:
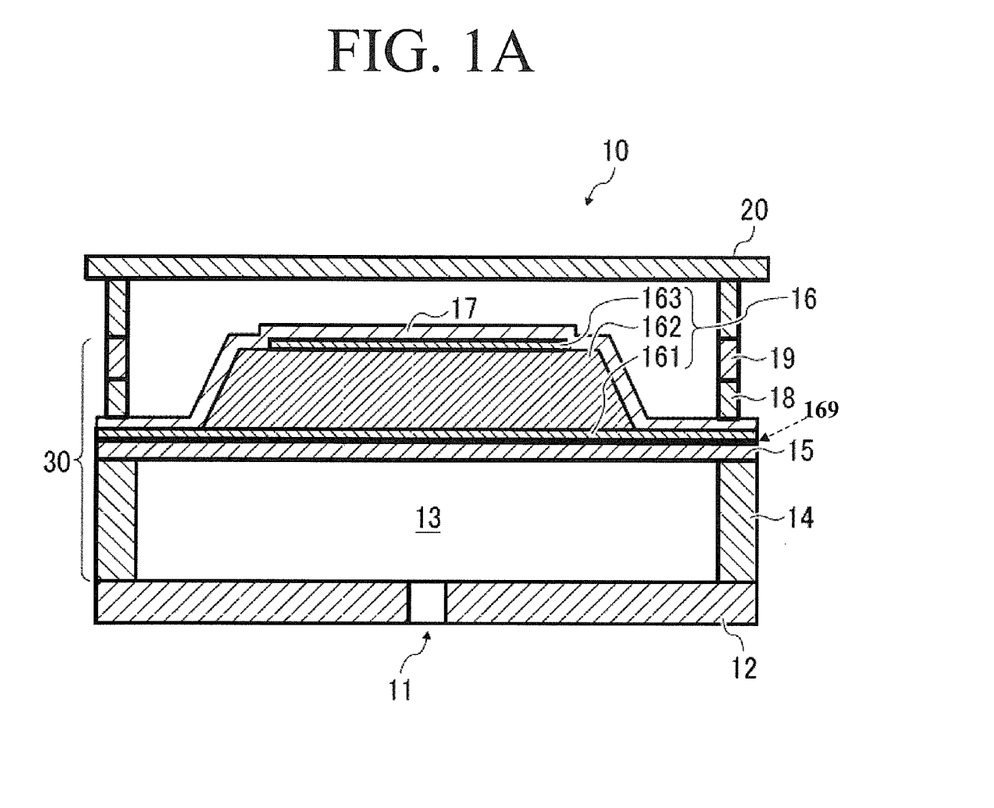
FIG. 1A is a schematic cross-sectional view of a liquid droplet discharge section, according to another embodiment.

The lower electrode (or common electrode) 161 is preferably formed of a metal or metal oxide. Herein, whichever material is used, an adherence layer 169 (FIG. 1A) may be formed between the metal films forming the diaphragm 15 and the lower electrode 161 to prevent separation or peeling. A detailed description of the metallic electrode film and the oxide electrode film including the adherence layer follows.

<Adherence Layer>

The adherence layer is formed as follows: A film made of titanium (Ti) is formed by sputtering, and the titanium film thus formed is oxidized with heat using a rapid thermal annealing (RTA) device, to thus obtain a titanium oxide film. Conditions of the thermal oxidation include: temperature ranging from 650[° C.] to 800[° C.], processing time from 1 min. to 30 min., and an $O_2$ atmosphere, for example. Among preparing methods for forming a titanium oxide film, the thermal oxidation method to oxidize the titanium film at a high temperature is more preferable than the reactive sputtering method, because, in the reactive sputtering method, a special sputtering chamber is necessary to heat the silicon substrate at a high temperature. In addition, oxidation with the RTA device is more preferable than the oxidation using a normal furnace because the crystalline property of the titanium oxide film formed by the RTA device is optimal. If the oxidation is performed using a normal heating furnace, the titanium film apt to be oxidized easily forms many crystalline structures in a low temperature, so that those structures have to be destroyed once. As a result, the oxidation using the RTA device with a rapid temperature rising property allows optimal crystals to be formed. Exemplary materials for use other than titanium or Ti include tantalum or Ta, iridium or Ir, rubidium or Ru, and the like. The thickness of the adherence layer is preferably from 10 [nm] to 50 [nm], and more preferably, from 15 [nm] to 30 [nm]. Below this range, the adherence property of the adherence layer is not secure. When the thickness of the adherence layer is more than 50 [nm], surface roughness of the lower electrode increases and the adherence property with the piezoelectric film decreases, so that the crystalline property of the piezoelectric film is adversely affected and sufficient deformation cannot be obtained for discharging ink.

<Metallic Electrode Film>

Exemplary materials for the metallic electrode film include platinum (Pt), which is conventionally used because of its high heat resistance and low reactivity. Platinum, however, does not have as high a barrier property as lead (Pb). Platinum group elements such as iridium and platinum-rhodium alloys and alloy films using these elements may be used. When platinum is used, adherence to an undercoat layer (such as $SiO_2$) is not optimal and therefore it is better to form the adherence layer in advance. In general, sputtering and vacuum deposition are used. The thickness of the metallic electrode film is preferably from 80 [nm] to 200 [nm], and more preferably, from 100 [nm] to 150 [nm]. When the metallic electrode film is thinner than the above range, a sufficient current cannot be supplied to the lower electrode 161, thereby adversely affecting the liquid droplet discharging. If the metallic electrode film is thicker than the above range, use of the platinum group elements may increase the production cost. In addition, if platinum is used, when the thickness is gradually increased, the surface roughness increases, which may adversely affect the surface roughness and the crystalline orientation of the oxide electrode film and PZT to be formed on the platinum film, and deformation sufficient for ink discharge cannot be obtained.

<Oxide Electrode Film>

Exemplary materials for the oxide electrode film include titanium or Ti. The oxide electrode film is formed by sputtering. The oxidation method of the oxide electrode film employs the RTA device as in the formation of the adherence layer, and the oxidation process is performed under conditions of: temperature ranging from 650[° C.] to 800[° C.], processing time from 1 min. to 30 min., and an $O_2$ atmosphere, for example. The reason for using the RTA device is the same as that described in the formation of the adherence layer. The thickness of the TiOx electrode film is preferably from 3 [nm] to 15 [nm]. As the materials for the sputtering film formation, other than Ti, Ti/Ir, PbO/TiOx, LNO, and the like are preferably used.

<Piezoelectric Member (Electromechanical Transducer Film)>

PZT is mainly used as the material for the piezoelectric member 162. PZT is a solid dispersion of lead zirconate ($PbZrO_3$) and lead titanate ($PbTiO_3$) and exhibits different properties depending on the ratios of these compounds. Composition of PZT exerting an optimal piezoelectric property is when ratios of $PbZrO_3$ and $PbTiO_3$ are 53:47, which is represented by chemical formulae: $Pb(Zr0.53, Ti0.47)O_3$, or in general, as PZT (53/47). Other than PZT, the composite oxide includes barium titanate. When using barium titanate, barium alkoxide and titanium alkoxide compounds are used as initial materials and barium titanate precursor solution is prepared by dissolving the initial materials in the common solution. These materials are described by the general formula $ABO_3$, which is a composite oxide mainly including A for Pb, Ba, or Sr, and B for Ti, Zr, Sn, Ni, Zn, Mg, or Nb. A specific description includes $(Pb_{1-x}, Ba)(Zr, Ti)O_3$, and $(Pb_{1-x}, Sr)(Zr, Ti)O_3$ obtained by partly replacing Pb as A with Ba or Sr. Such replacement is possible as long as the replaced element is a divalent element, and due to the replacement, degradation of a specific property due to evaporation of lead during thermal processing is prevented.

As a method of producing the piezoelectric member 162, sputtering or the sol-gel method is used, employing a spin coater is used. In this case, because patterning is necessary, a desired pattern can be obtained by photolithographic etching and the like. When PZT is prepared by the sol-gel method, lead acetate, zirconium alkoxide, and titanium alkoxide as initial materials are dissolved in methoxy ethanol as a common solvent, so that a homogeneous solution can be obtained and the PZT precursor solution can be prepared. Because metallic alkoxide compounds are susceptible to hydrolysis due to moisture in the atmosphere, an appropriate amount of acetylacetone, acetic acid, or diethanolamine may be added as a stabilizer to the precursor solution.

When the piezoelectric member 162 (PZT film) is formed over the whole surface of the substrate 14, a coating film is formed by a solution coating method such as spin coating, and the formed film is subjected to various thermal processes including solvent drying, thermal decomposition, and crystallization. When the coated film is transformed into a crystallized film, the volume of the film contracts. To obtain a crack-free film, the precursor density needs to be adjusted so as to obtain a thickness not more than 100 [nm] in a one-time process.

The thickness of the piezoelectric member 162 preferably ranges from 0.5 [μm] to 5 [μm] and more preferably from 1 [μm] to 2 [μm]. When the thickness is less than 0.5 [μm], sufficient transformation or displacement is not generated.

When the thickness is more than 5 [μm], because several layers are laminated one after another, the number of steps increases and processing time becomes lengthy.

In addition, specific dielectric constant of the piezoelectric member 162 preferably ranges from 600 to 2,000, and more preferably, from 1,200 to 1,600. When the specific dielectric constant is less than 600, sufficient transformation or displacement is not generated. When the specific dielectric constant thereof is more than 2,000, polarization is insufficient, thereby degrading the displacement property after repeated use.

<Upper Electrode (Individual Electrode)>

The upper electrode or the individual electrode 163 is preferably formed of a metal or metal oxide. Details of an oxide electrode film and a metallic electrode film will be described.

<Oxide Electrode Film>

Exemplary materials for the oxide electrode film includes strontium ruthenium oxide or $SrRuO_3$ (hereinafter, "SRO"). Other than $SrRuO_3$, materials represented by $Sr_x(A)_{(1-x)}Ru_y(B)_{(1-y)}$ are preferred, in which A=Ba, Ca; B=Co, Ni; and x or y=0 to 0.5. The oxide electrode film is formed by a film formation method such as sputtering. The thickness of the oxide electrode film (or SRO film) is preferably from 20 [nm] to 80 [nm], and more preferably, from 40 [nm] to 60 [nm]. If the film is thinner than the above range, sufficient and optimal initial transformation or displacement property is not obtained. In addition, when the thickness of the oxide electrode film exceeds the above range, dielectric strength of the later film-formed piezoelectric film (PZT film) is poor, and leakage tends to occur.

<Metallic Electrode Film>

Preferred materials for the metallic electrode film are the same as those used for the metallic electrode film of the lower electrode or the common electrode 161 as described above. The thickness of the metallic electrode film is preferably from 30 [nm] to 200 [nm], and more preferably, from 50 [nm] to 150 [nm]. If the film is thinner than the above range, a sufficient current cannot be supplied as the upper electrode or the individual electrode 163, and failure occurs when the liquid droplet is discharged. Further, if the metallic electrode film is thicker than the above range, use of the precious material included in the platinum group elements may increase the production cost. In addition, if the platinum is used as the material, when the thickness becomes gradually thicker, the surface roughness increases and process failure such as the film peeling tends to occur when wiring is installed through the insulation protective film.

<First Insulation Protective Film>

Care should be taken when selecting materials for the first insulation protective film 17 and preferred materials thereof include dense inorganic materials that can prevent damage to the piezoelectric element in the film formation and etching and prevent permeation of moisture in the atmosphere. In addition, when organic material is used for the first insulation protective film 17, the thickness should be enough to obtain sufficient protection performance, and therefore organic material is not suitable. When the first insulation protective film 17 is a thick film, vibration of the diaphragm 15 is greatly impaired and discharge property of the liquid droplet discharge head is degraded. To obtain good protection even with a thin film, use of oxide, nitride, and carbonized film is preferable; however, materials having a high adherence property with materials for the electrode as a base of the first insulation protective film 17, for the piezoelectric member, and for the diaphragm need to be selected. In addition, a film formation method of the first insulation protective film 17 that does not damage the piezoelectric element 16 should be selected. Specifically, plasma CVD, in which reactive gas is turned into plasma collected on the substrate, or sputtering, in which plasma is ejected toward a target member and sputtered ions form a film, are not preferred. Examples of preferable film formation methods for the first insulation protective film 17 include vapor deposition, atomic layer deposition (ALD), and the like. Given the wide variety of useable materials, the ALD method is preferable. Preferred materials for the first insulation protective film is oxide films for use as materials for ceramics and include $Al_2O_3$, $ZrO_2$, $Y_2O_3$, $Ta_2O_3$, $TiO_2$, and the like. In particular, by using ALD, a thin film having a very high density can be formed, thereby preventing any damage from occurring in the processing.

The first insulation protective film 17 needs to be as thin as possible but can provide good protection of the piezoelectric element 16 and allow the diaphragm 15 to be deformed or displaced. The thickness of the first insulation protective film 17 preferably ranges from 20 [nm] to 100 [nm]. When the thickness thereof is greater than 100 [nm], because the deformation or displacement amount of the diaphragm 15 decreases, liquid discharge performance of the liquid droplet discharge head is low. On the other hand, if the thickness thereof is less than 20 [nm], because the function of the piezoelectric element 16 as a protective layer becomes insufficient, performance of the piezoelectric element 16 decreases as described above.

<Second Insulation Protection Film>

Exemplary materials suitable for the second insulation protective film 18 include specific oxide, nitride, carbonate, or composite compounds including the foregoing materials; alternatively, $SiO_2$ that is used in general for semiconductor devices can be used. Methods used for the film formation of the second insulation protective film 18 include, for example, CVD, sputtering, and ALD. CVD capable of forming a film isotropically is preferably used considering stepwise deposition of the pattern forming part of the electrode forming part. The thickness of the second insulation protective film 18 needs to be such that the voltage applied to a portion between the common electrode (i.e., the lower electrode) 161 and the wire 22 of the individual electrode 163 does not break down the insulation thereof. Specifically, the strength of the electric field applied to the second insulation protective film 18 needs to be set to a range in which insulation breakdown does not occur. Further, when considering the surface roughness or pinholes of the undercoat layer of the second insulation protective film 18, the thickness of the second insulation protective film 18 needs to be not less than 200 [nm] and preferably not less than 500 [nm].

<Wire; Pad Electrode>

It is preferred that the materials for the wires 21, 22 and a pad electrode be metallic materials for the electrode formed from any one of Ag alloy, Cu, Al, Au, Pt, or Ir. Those electrodes can be formed using sputtering, spin coating, and the like, and thereafter, a desired pattern is obtained via photolithographic etching and the like. The thickness of the electrode is preferably from 0.1 [μm] to 20 [μm], and more preferably, from 0.2 [μm] to 10 [μm]. If the thickness is less than the above range, the resistance increases, sufficient current cannot be supplied to the electrode, so that the liquid droplet discharge from the head becomes unstable. By contrast, if the thickness is more than the above range, the process time lengthens. In addition, a contact resistance at the contact hole (for example, with an area 10 [μm]×10 [μm]) through which the lower electrode 161 and the individual electrode 163 can be connected, is set to not more than 10[Ω] for the lower electrode or the common electrode 161 and not more than 1[Ω] for the upper electrode or the individual electrode 163, more preferably, not more than 5[Ω] for the lower electrode 161 and not more than 0.5[Ω] for the individual electrode 163. If the resistance is higher than the above range, sufficient current cannot be applied, and failure occurs when the liquid droplet is discharged.

<Third Insulation Protective Film>

The third insulation protective film 19 serves as a passivation layer and also functions as a protective layer for the wire 21 of the common electrode and the wire 22 of the individual electrode. As illustrated in FIG. 2, the individual electrode 163 and the lower electrode 161 are entirely coated except for an outgoing portion of the individual electrode 163 and an outgoing portion (i.e., the contact hole 18*a*) of the lower electrode 161. With this structure, cost-effective aluminum Al or an alloy mainly formed of Al may be used for the material of the electrode. As a result, a low-cost and highly reliable liquid droplet discharge head (or an inkjet head) can be obtained. Materials for the third insulation protective film 19 include any inorganic or organic material, but with low moisture permeability. Exemplary inorganic materials include oxide, nitride, and carbonate, and exemplary organic materials include polyimide, acrylic resin, and urethane resin. However, if organic material is used, the thickness thereof needs to be thick, so that organic materials are not suitable for patterning. As a result, inorganic materials are preferable because the wiring protection function is obtained even with a thin film. In particular, use of $Si_3N_4$ on Al wiring that exerts efficiency for use in the semiconductor devices, is preferable. In addition, the thickness of the film is preferably not less than 200 [nm], and more preferably, not less than 500 [nm]. If the thickness is not sufficient, a sufficient passivation effect cannot be exerted, and breaking of wires occurs due to corrosion of the wire materials, thereby degrading reliability in inkjet discharging.

In addition, it is preferred that openings be disposed on the piezoelectric element 16 and the diaphragm 15 around the piezoelectric element 16. As a result, the same effect can be obtained similarly to the first insulation protective film 17 that includes a thin film area corresponding to the liquid chamber 13. With this configuration, a highly efficient and reliable liquid droplet discharge head (or inkjet head) can be formed. Because the piezoelectric element 16 is protected by the first and second insulation protection films 17, 18, the opening of the third insulation protective film 19 can be formed by the photolithography method and dry etching. In addition, an area of the pad electrode is preferably not less than 50×50 [μm²] and, more preferably, not less than 100×300 [μm²].

Next, an example of a method for producing the liquid droplet discharge section 10 will be described.

Figure 3:
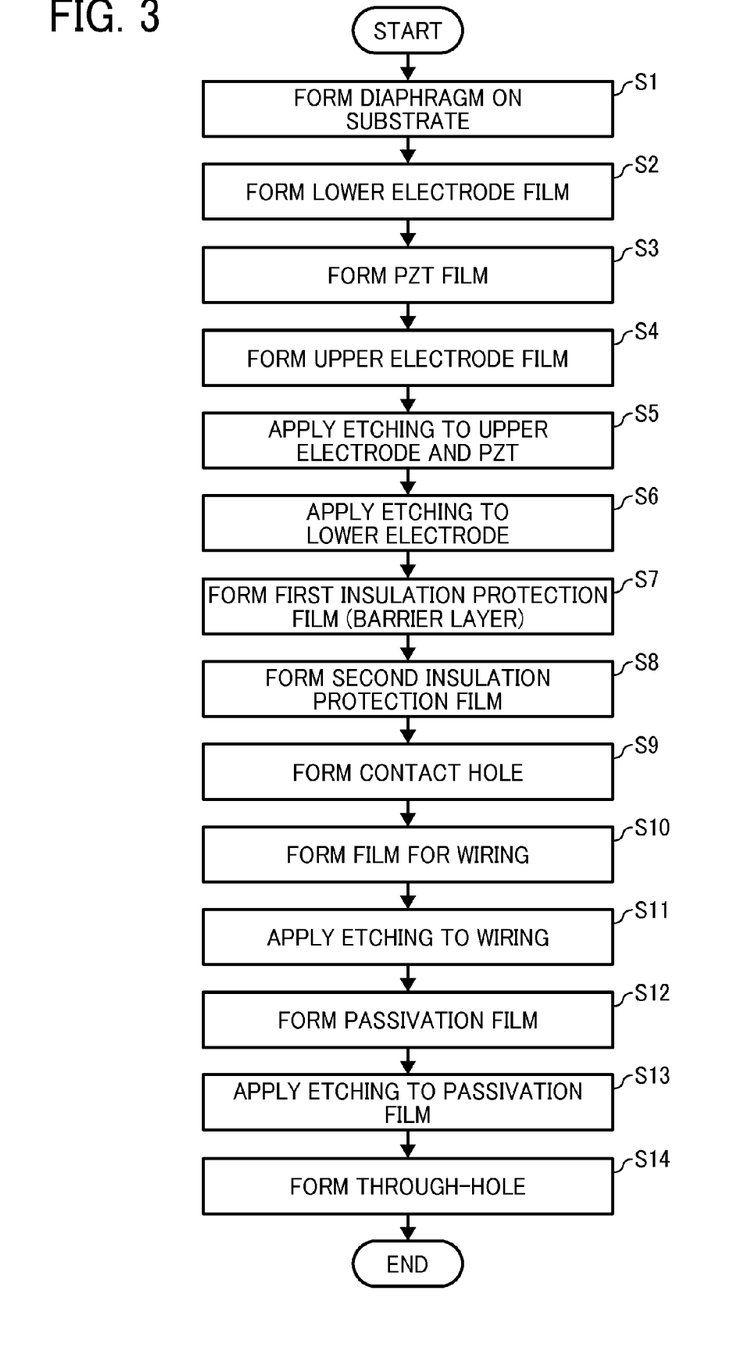
FIG. 3 is a flowchart illustrating steps of one exemplary production process of the liquid droplet discharge section.

FIG. 3 is a flowchart illustrating steps in an exemplary production process of the liquid droplet discharge section.

First, on the substrate 14, a diaphragm 15 is formed (in Step S1). A silicon wafer having a thickness of 625 [μm] is used as a substrate 14. The diaphragm 15 including a thermal oxidation film, a silicon oxide film, a silicon nitride film, and a polysilicon film formed, for example, by the CVD method as appropriately is disposed on the substrate 14.

Next, the piezoelectric element 16 is formed on the diaphragm 15. In producing the piezoelectric element 16, first, the film formation of the lower electrode being the common electrode 161 is done (S2), the film formation of PZT film being the piezoelectric member 162 is subsequently done (S3) and the film formation of the upper electrode 163 being the individual electrode is done (S4).

The film formation of the lower electrode in Step S2 is specifically done as follows: First, as an adherence film, the titanium film having a film thickness of 30 [nm] is formed by the sputtering device and is subjected to the thermal oxidation using RTA at 750 degrees C. Thereafter, a platinum film having a film thickness of 100 [nm] is formed, and $SrRuO_3$ film as an oxide film having a thickness of 60 [nm] is formed by sputtering. The film formation by the sputtering is performed by heating the substrate at 550 degrees C.

In the above Step S3, the PZT film is formed with a desired thickness by the sol-gel method.

The film formation of the upper electrode in Step S4 is performed by using $SrRuO_3$ film as an oxide film having a thickness of 40 [nm] and Pt film as a metallic film having a thickness of 125 [nm], both are formed by sputtering.

Thereafter, film formation is performed to Photoresist (TSMR8800, product name) produced by Tokyo Ohka Kogyo Co., Ltd. by spin coating, and a resist pattern is formed using ordinary photolithography. Thereafter, the PZT film and the upper electrode are individualized by etching using inductively coupled plasma (ICP) etching device (produced by SAMCO Inc.), and a pattern was formed (S5). Due to this process, the upper electrode functions as an individual electrode.

Subsequently, in the similar method, a resist pattern is formed using photolithography, and a pattern for the lower electrode was formed (S6). The lower electrode 161 is so pattern-formed as to function as a common electrode relative to the plurality of piezoelectric members 162 and the upper electrode 163 not to be individualized as in the PZT film or the upper electrode. The patterning for the lower electrode 161 will be described later in detail.

Next, as the first insulation protective film 17, $Al_2O_3$ film is formed by ALD method (S7). The first insulation protective film 17 functions as a barrier layer to protect the piezoelectric element 16 from process damage such as hydrogen. By using $Al_2O_3$ film formed by ALD method for the first insulation protective film 17 or the barrier layer, a high-quality barrier layer with a low moisture permeability can be obtained.

The thickness of the first insulation protective film 17 functioning as a barrier layer preferably ranges from 30 [nm] to 80 [nm]. With this structure, while maintaining sufficient impermeability as a barrier layer, the first insulation protective film 17 maintains a function as an actuator of the piezoelectric element 16.

In addition, a taper angle formed between the surface of the substrate 14 and a side wall of the second insulation protective film 17 is preferably smaller than that formed between the surface of the substrate 14 and the side wall of the piezoelectric element 16. With this structure, a concentration of stress at lateral ends of the piezoelectric element 16 is minimized, thereby extending the lifetime and improving the reliability of the discharge head.

Next, as the second insulation protective film 18, an $SiO_2$ interlayer film is formed (S8). By using the $SiO_2$ film disposed between two layers, without adding a new step, a second protection film is further prepared for a portion covering the side wall of the piezoelectric element 16 within the first insulation protective film 17 (or the barrier layer). Accordingly, reduction of the production performance and increase of the production cost can be prevented. In addition, in the photolithography etching process as a post-treatment process, the side wall of the piezoelectric element 16 is masked by the resist and is subject to etching, thereby allowing the $SiO_2$ interlayer film to remain at a portion covering the side wall of the piezoelectric element 16 within the first insulation protective film 17 (or the barrier layer). Accordingly, an excessive etching of the first insulation protective film 17 (or the barrier layer) can be prevented more securely.

The above SiO$_2$ interlayer film preferably has a thickness ranging from 10 [nm] to 500 [nm]. If the thickness thereof is less than 10 [nm], a sufficient etching tolerance cannot be obtained. By contrast, if the thickness thereof is more than 500 [nm], the piezoelectric element 16 is not deformable, so that the function as an actuator is not maintained.

Thereafter, a contact hole 18a is formed by etching (S9). The Al film formation by sputtering is performed to form a wire (S10). Then, the Al of which a film is formed in Step S10 is subject to etching and patterning is done (S11).

Further subsequently, SiN passivation layer is formed as the third insulation protective film 19, and the formed layer is subject to etching (S12 and S13).

Finally, a through-hole as an ink supply port 34 is formed by etching on the diaphragm (S14).

The thus-formed substrate 14, the piezoelectric element 16, and a composite layered substrate including various electrodes forms an electromechanical transducer member which is called an actuator substrate 30.

Figure 4:
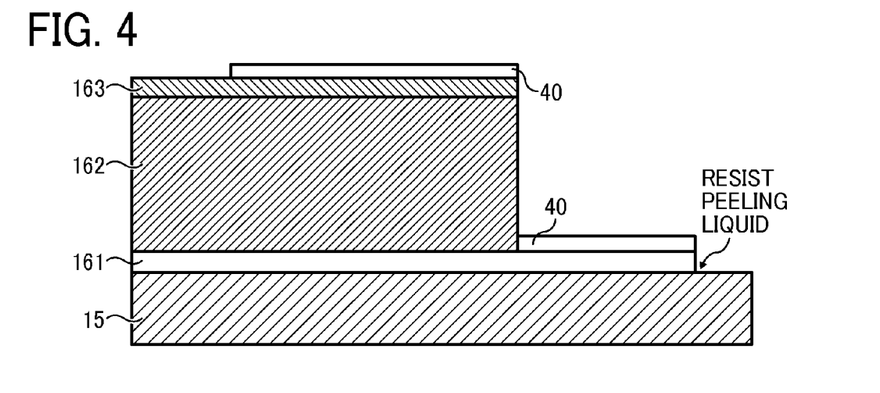
FIG. 4 illustrates patterning of a lower electrode when a piezoelectric element is formed on the diaphragm.
Figure 5:
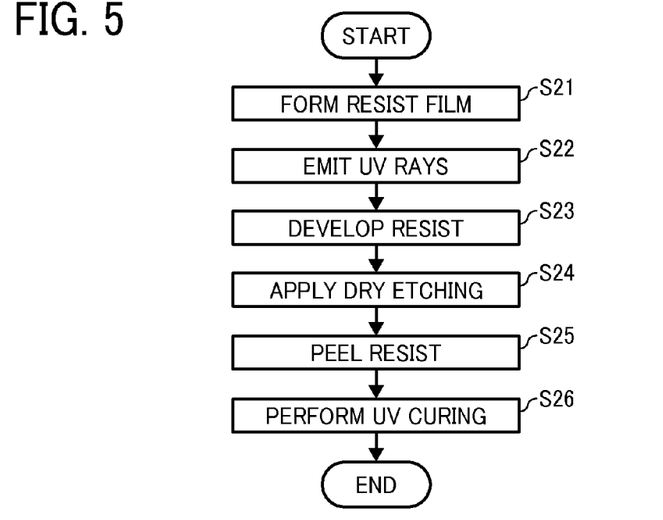
FIG. 5 is a flowchart showing details of the patterning process of the lower electrode.

Herein, patterning of the lower electrode 161 will be described in detail. FIG. 4 illustrates patterning of the lower electrode when the piezoelectric element is formed on the diaphragm. In addition, FIG. 5 is a flowchart illustrating a detailed process of patterning the lower electrode.

First, a photoresist is formed by spin coating (in Step S21), ultraviolet UV rays are irradiated to the formed photoresist (S22), and the resist is developed (S23). Through this process, a resist pattern 40 is formed on the piezoelectric member (PZT) 162 and the upper electrode 163 patterned in Step S5 described above, and on the lower electrode 161 which will be pattern-formed. Subsequently, a pattern of the lower electrode 161 on which the resist pattern 40 is not formed is formed by dry-etching (S24). Then, using a chemical liquid for resist separation, the resist is separated (S25), and finally, the resist is dried by subjecting UV cure (S26).

During patterning the lower electrode 161, the lower electrode 161 tends to peel away from the diaphragm 15. Specifically, when the resist peeling is performed using the chemical liquid in the patterning of the lower electrode 161 (S25), the chemical liquid attacks the peripheral portion of the lower electrode 161. In this case, when the corners of the lower electrode 161 are angled as in FIG. 12, the chemical liquid attacks the corner from two directions that form each corner as shown by arrows in FIG. 12 and may enter into a portion between the bottom surface of the lower electrode 161 and the diaphragm 15 from the corners of the lower electrode 161. When the chemical liquid enters into the portion between the bottom surface of the lower electrode 161 and the diaphragm 15, the lower electrode 161 tends to be peeled from the diaphragm 15. When the lower electrode 161 is peeled therefrom, the lower electrode 161 attaches to an undesired portion on the actuator substrate 30, which may create a short-circuit, or alternatively, stop driving the piezoelectric element 16 due to insulation.

Figure 6:
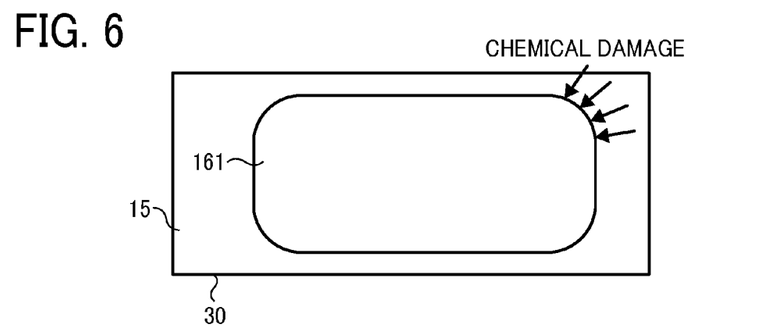
FIG. 6 illustrates the lower electrode with an end corner being attacked by a chemical liquid.

By contrast, in the present embodiment, the corners of the lower electrode 161 are rounded as illustrated in FIG. 6. With this configuration, the chemical liquid attacks the corner of the lower electrode 161 from directions along the rounded shape of the corner, and therefore, it is difficult for the chemical liquid to enter into the portion between the bottom surface of the lower electrode 161 and the diaphragm 15 compared to the case in which each corner of the lower electrode 161 is angled. As a result, the lower electrode 161 does not tend to be peeled from the diaphragm 15 and thus a highly reliable actuator substrate 30 can be obtained.

The liquid droplet discharge head 1 according to the present embodiment is configured such that the sub frame 20 as a structural member is laminated on the thus-formed actuator substrate 30 so as to cover the piezoelectric element 16 without contacting the piezoelectric element 16. Subsequently, a portion opposite the piezoelectric element forming surface of the substrate 14 is polished to a desired thickness. Then, the polished side is etched, so that the concave portion that will be the liquid chamber 13, the fluid resistor 32, and the ink inlet 33 is formed. The nozzle substrate 12 on which the nozzle 11 is formed is laminated on the liquid chamber forming side of the substrate 14.

For simplicity, the illustration of liquid supply means, channel, fluid resistance, and the like is omitted, but other parts and components that can be disposed to the liquid droplet discharge head may be provided.

Next, a more complete embodiment of the actuator substrate 30 with rounded corners of the lower electrode and evaluation results thereof will be described, with the understanding that the present invention is not limited thereto.

Figure 7:
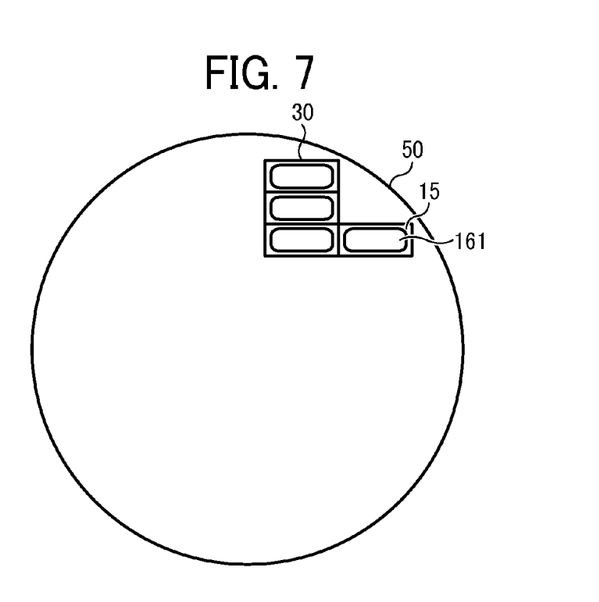
FIG. 7 schematically illustrates formation of a plurality of actuator substrates or chips in a single silicon wafer.

As illustrated in FIG. 7, a plurality of rectangular areas (each one an actuator chip) that serves as the actuator substrate 30, is disposed on a silicon wafer 50. The silicon wafer 50 will be the substrate 14.

<Experiment 1>

Figure 8A:
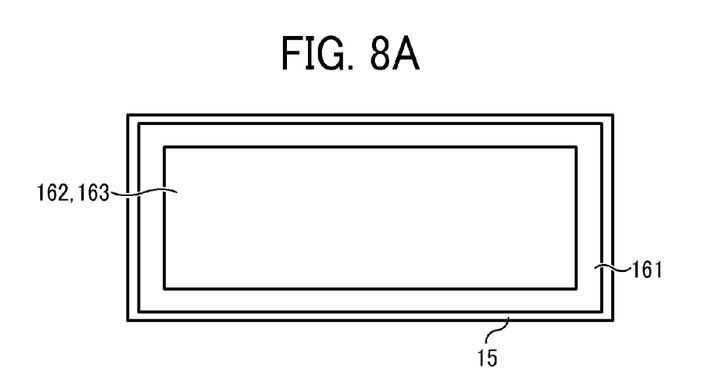
FIG. 8A illustrates a conventional lower electrode with right-angled corners.
Figure 8B:
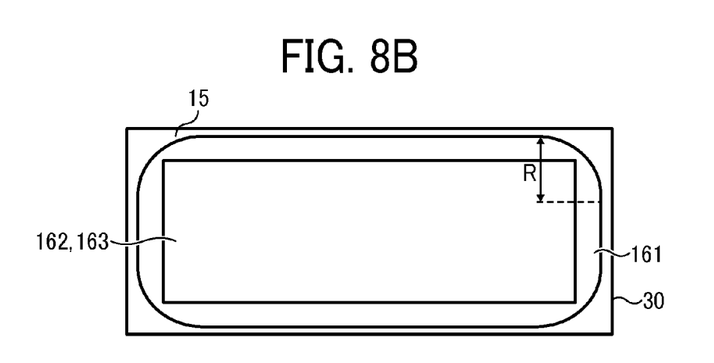
FIG. 8B illustrates a lower electrode with round corners having a curvature radius R.
Figure 9:
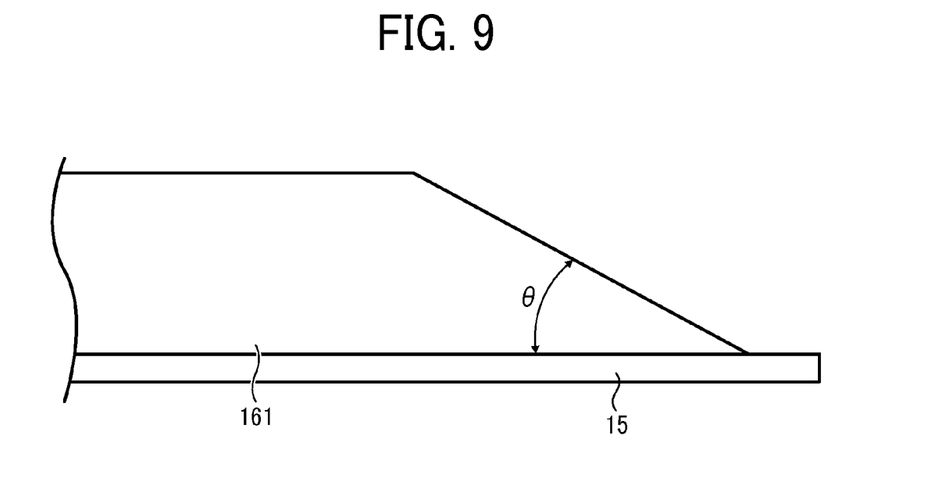
FIG. 9 illustrates a taper angle θ of the lower electrode relative to the diaphragm according to the present embodiment.

In preparing the actuator substrate or the actuator chip 30, a mask pattern of the lower electrode 161 in the etching process is changed so that the four corners of the lower electrode 161 become rounded (as in FIG. 8B) from angled (as in FIG. 8A). In this case, a curvature radius R of the rounded shape was varied over a range of from 1 to 100 [μm]. In FIG. 8, the piezoelectric member 162 and the upper electrode 163 are individualized, which is not depicted in the figure. In addition, the taper angle θ (see FIG. 9) of the lower electrode 161 relative to the diaphragm 15 was set to 80 degrees. It was observed whether or not the film peeling occurs in the resist peeling (in Step S25) in patterning the lower electrode 161 as illustrated in FIG. 5. Amine-system resist peeling liquid was used as a chemical liquid, and peeling was observed 15 minutes after the use of the chemical liquid as a standard treatment time, and 30 minutes after the use of the chemical liquid for observing the tolerability.

Table 1 shows results of the peeling relative to the curvature radius R.

TABLE 1

| | Peeling of lower electrode film? | |
|---|---|---|
| Curvature radius R [μm] of corners of lower electrode | Treatment period: 15 min. | Treatment period: 30 min. |
| 1 | YES | YES |
| 5 | NO | YES |
| 20 | NO | NO |
| 50 | NO | NO |
| 100 | NO | NO |

From the results in Table 1, peeling of the film does not occur as to the actuator substrate 30 having four corners of the lower electrode 161 with the curvature radius of not less than 5 [μm], 15 minutes later after the resist peeling treatment.

<Experiment 2>

In preparing the actuator substrate or the actuator chip 30, the curvature radius R of the rounded shape of the four corners of the lower electrode 161 is set to 5 [μm] and the taper angle θ (see FIG. 9) of the lower electrode 161 relative to the diaphragm 15 was changed in a range from 40 to 80 degrees. Similarly to Experiment 1, it was observed whether or not peeling of the lower electrode 161 occurs in the resist peeling (S25) in patterning the lower electrode 161. Amine-system resist peeling liquid was used as a chemical liquid, and peeling was observed 15 minutes after the use of the chemical liquid as a standard treatment time, and 30 minutes after the use of the chemical liquid for observing the tolerability.

Table 2 shows results of existence or non-existence of the peeling relative to the taper angle θ.

TABLE 2

| Taper angle θ [degrees] relative to diaphragm | Peeling of lower electrode film? | |
| --- | --- | --- |
| | Treatment period: 15 min. | Treatment period: 30 min. |
| 40 | NO | NO |
| 60 | NO | NO |
| 80 | NO | YES |

From the results in Table 2, it was confirmed that the tolerability to the attack of the chemical resist peeling liquid is improved when the taper angle θ is not more than 60 degrees.

Further, using the actuator substrate 30 with a desired shape by dicing from the silicon wafer 50, a liquid droplet discharge head 1 was formed, and the liquid droplet discharge performance of the head was evaluated. Ink with adjusted viscosity of 5 cp was used and the liquid droplet discharging performance was confirmed by applying voltage of −10 to −30 volts having a simple Pull waveform. As a result, it was confirmed that all the nozzles 11 discharge ink liquid droplets optimally.

Thus, when the four corners of the lower electrode 161 are rounded, the chemical liquid hardly enters into the portion between the lower surface of the lower electrode 161 and the diaphragm 15, so that the lower electrode 161 does not peel off from the diaphragm 15.

The patterning process of the lower electrode 161 is not limited to the method described above, and alternatively, a method in which, after the lower electrode 161 is pattern-formed, the piezoelectric member 162 and the upper electrode 163 are pattern-formed, may be employed and the same effect can be obtained.

Next, an inkjet recording apparatus, as an image forming apparatus, including the liquid droplet discharge head 1 according to the present embodiment will be described.

Figure 10:
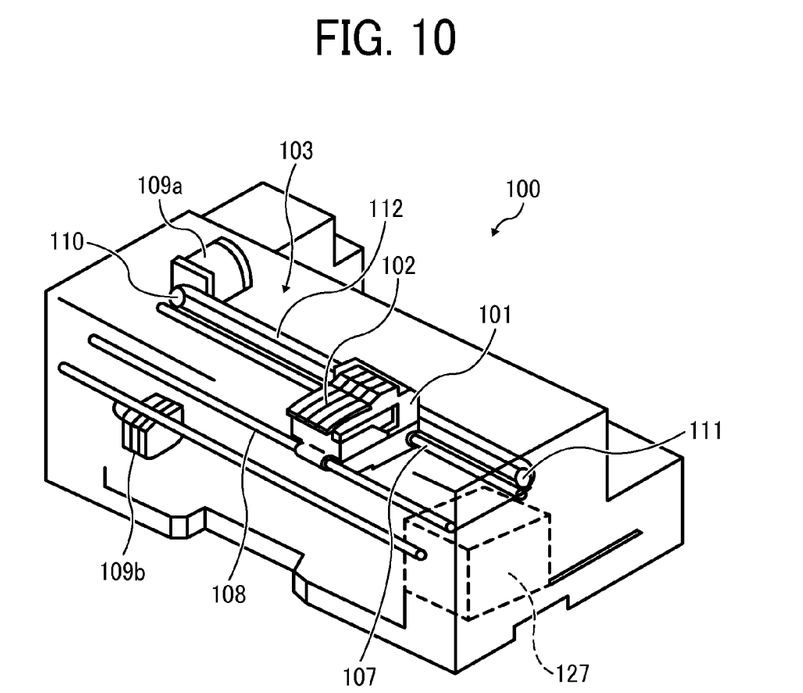
FIG. 10 is a perspective view of an inkjet recording apparatus including a liquid droplet discharge head according to the embodiment of the present invention.
Figure 11:
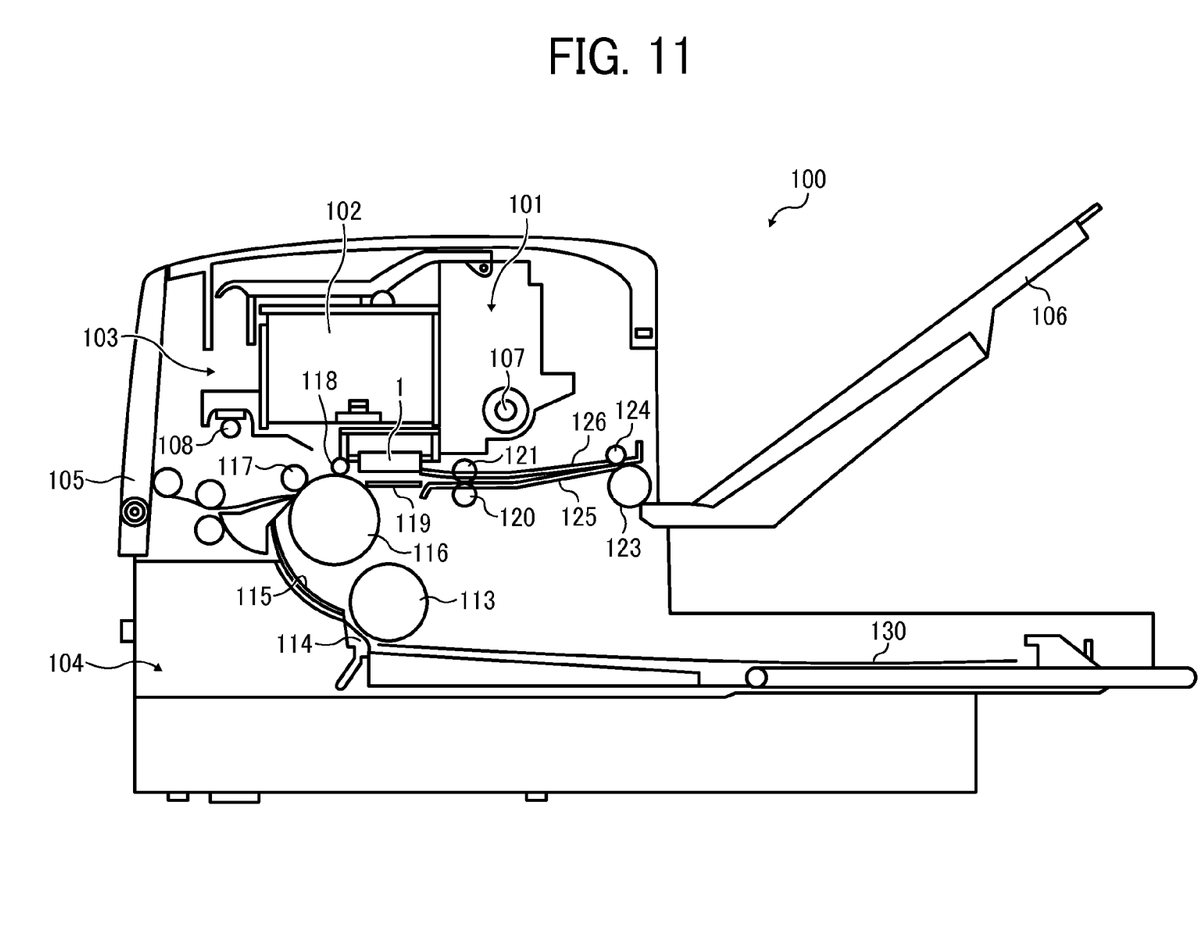
FIG. 11 is a cross-sectional side view illustrating an exemplary structure of the inkjet recording apparatus including the liquid droplet discharge head according to the present embodiment.

FIG. 10 is a perspective view of the inkjet recording apparatus including the liquid droplet discharge head according to the embodiment of the present invention. FIG. 11 is a cross-sectional side view illustrating an exemplary structure of the inkjet recording apparatus 100.

A printing system 103 is incorporated in the inkjet recording apparatus 100. A paper tray 104 accommodating a plurality of recording sheets 130 that can be loaded into the apparatus body from the front is detachably attached below the apparatus body. In addition, a manual tray 105 that can be used to manually feed the recording sheet 130 is provided. The recording sheet 130 supplied from the paper tray 104 or the manual tray 105 is conveyed to the apparatus and, after a predetermined image has been recorded by the printing system 103, the recording sheet 130 is discharged onto a sheet discharge tray 106 disposed at a rear side of the apparatus.

The printing system 103 further includes a carriage 101 movable in a main scanning direction, a liquid droplet discharge head mounted on the carriage 101, and an ink cartridge 102 to supply ink to the liquid droplet discharge head. The printing system 103 includes a main guide rod 107 and an auxiliary guide rod 108, which are guide members disposed laterally between right and left side plates and slidably hold the carriage 101 to be movable in a main scanning direction. The liquid droplet discharge head to discharge ink droplets of respective colors of yellow (Y), cyan (C), magenta (M), and black (K) is mounted on the carriage 101 with a plurality of ink discharge ports or nozzles arranged in a direction perpendicular to the main scanning direction, with the ink droplet discharging direction oriented downward. Each of the ink cartridges 102 to supply ink of respective colors to the liquid droplet discharge head is replaceably mounted on the carriage 101.

The ink cartridge 102 includes an air hole disposed above, to communicate with atmospheric air, and a supply port disposed below, to supply the ink to the liquid droplet discharge head. There is an ink-filled porous body inside the ink cartridge 102, and the ink to be supplied to the liquid droplet discharge head is kept at a slight negative pressure due to capillary force of the porous body. In addition, the liquid droplet discharge heads for respective colors are employed in the present embodiment, but a single liquid droplet discharge head having nozzles to discharge ink droplets of each color may be used.

The carriage 101 slidably engages a main guide rod 107 at a rear side of the apparatus (downstream in a sheet conveyance direction) and slidably engages an auxiliary guide rod 108 at a front side of the apparatus (upstream in the sheet conveyance direction). A main scan motor 109a drives to rotate a drive pulley 110 and a driven pulley 111 and a timing belt 112 is stretched over the pulleys 110 and 111. The timing belt 112 is fixed to the carriage 101, so that the carriage 101 moves and scans in the main scanning direction. With this structure, when the main scan motor 109a rotates back and force, the carriage 101 is driven to move reciprocally.

A sheet feed roller 113 and a friction pad 114, both to separate and convey the sheet 130 one by one from the paper tray 104, and a guide member 115 to guide the sheet 130 are disposed to convey the sheet 130 placed in the paper tray 104 below the liquid droplet discharge head. Further, a conveyance roller 116 to reverse and convey the fed sheet 130, another conveyance roller 117 to be pressed against a peripheral surface of the conveyance roller 116, and a tip end roller 118 to define a conveyance angle of the sheet 130 from the conveyance roller 116 are disposed. The conveyance roller 116 is driven by a sub-scan motor 109b via a gear array.

A print receiver 119 serving as a sheet guide to guide the recording sheet 130, sent from the conveyance roller 116, is disposed below the liquid droplet discharge head corresponding to a moving range of the carriage 101 in the main scanning direction. Further, a conveyance roller 120 and a spur 121 are disposed downstream of the print receiver 119 in the sheet conveyance direction and rotate to convey the sheet 130 to a sheet ejection direction. Furthermore, a paper ejection roller 123 and a spur 124 to send out the sheet 130 to a sheet ejection tray 106 and guide members 125, and 126 to form a sheet ejection path are disposed.

In the recording operation by the thus-configured inkjet recording apparatus 100, the liquid droplet discharge heads are driven in response to image signals while moving the carriage 101, to thus discharge ink droplets onto the stopped sheet 130 to record a single line. After the sheet 130 is conveyed by a predetermined distance, a next line is recorded. Upon receiving a recording end signal or a signal indicating that a trailing edge of the sheet 130 has reached the recording area, the recording operation is terminated and the sheet 130 is ejected.

Further, a recovery unit 127 to recover discharge failure of the liquid droplet discharge head is disposed at a right end in the moving direction of the carriage 101 and outside the recording area. The recovery unit 127 includes a cap, a suction means, and a cleaner. In the standby time, the carriage 101 moves toward the recovery unit 127, where the liquid droplet discharge head is capped by the cap, so that the discharging port of the liquid droplet discharge head is kept damped and discharge failure due to ink drying can be prevented. In addition, by discharging unnecessary ink for recording during operation, ink viscosity of all discharging ports is kept constant, thereby maintaining stable discharging performance.

When discharge failure occurs, the discharging port or the nozzle of the liquid droplet discharge head 1 is sealed by the cap, and the suction means absorbs ink and bubbles from the nozzle. With this operation, the ink and dust adhered around the discharging port are removed by the cleaner and discharging failure is recovered. The absorbed ink is discharged in a waste ink reservoir disposed in the bottom of the apparatus, and is absorbed by an ink absorber disposed inside the waste ink reservoir. Thus, in the present inkjet recording apparatus 100 according to the present embodiment, because the recovery unit 127 is disposed, discharging failure of the liquid droplet discharge head is recovered and a reliable ink liquid discharging property can be obtained, thereby improving the image quality.

In the present embodiment, a case in which the liquid droplet discharge head is applied to the inkjet recording apparatus 100 has been described, but the liquid droplet discharge head 1 can be applied to the device to discharge a liquid resist for patterning other than the ink.

In the inkjet recording apparatus or the image forming apparatus 100 according to the present embodiment, because the liquid discharge head according to the present embodiment may be used as the recording head, a high quality image can be reliably formed. The inkjet recording apparatus including the liquid droplet discharge head discharges ink droplets to be adhered to the sheet via the liquid droplet discharge head while conveying the recording medium and forms images on the medium. In the present description, the medium may be referred to as "sheet" but not limited thereto, and includes a recorded medium, recording medium, transfer medium, and the recording sheet, and the like. The "image forming apparatus" means an apparatus to perform image formation by discharging liquid droplets to various media such as paper, thread, fiber, fabric, leather, metals, plastics, glass, wood, ceramics, and the like. The term "image formation" means not only forming images with letters or figures having meaning to the medium, but also forming images without meaning such as patterns to the medium (and simply impacting the droplets to the medium). The ink is not limited to so-called ink, but means and is used as an inclusive term for every liquid including such as DNA sample, registration and pattern materials.

Further, the image forming apparatus includes, otherwise limited in particular, any of a serial-type image forming apparatus and a line-type image forming apparatus.

The aforementioned embodiments are examples and specific effects can be obtained for each of the following aspects of (A) to (H):

Aspect A

Provided is an electromechanical transducer such as an actuator substrate 30 including an electromechanical transducer element such as a piezoelectric element 16 including a lower electrode 161, a piezoelectric member 162 and an upper electrode 163 each of which is formed with a desired pattern by patterning each film, that is, a lower electrode film to form the lower electrode 161, a piezoelectric member film to form the piezoelectric member 162, and an upper electrode film to form the upper electrode 163, so that the lower electrode, the piezoelectric member, and the upper electrode are formed each with a desired pattern. In such an electromechanical transducer, four corners of the lower electrode 161 are rounded.

In the electromechanical transducer as described in the above embodiment, the lower electrode film, the piezoelectric member film, and the upper electrode film are patterned via a resist pattern formation by photo-lithography, etching, and resist peeling using a chemical liquid. With the above treatment, the electromechanical transducer element including the electromechanical transducer element is obtained, in which the lower electrode, the piezoelectric member, and the upper electrode, each of which has a desired pattern, are laminated in layers on the diaphragm.

Figure 12:
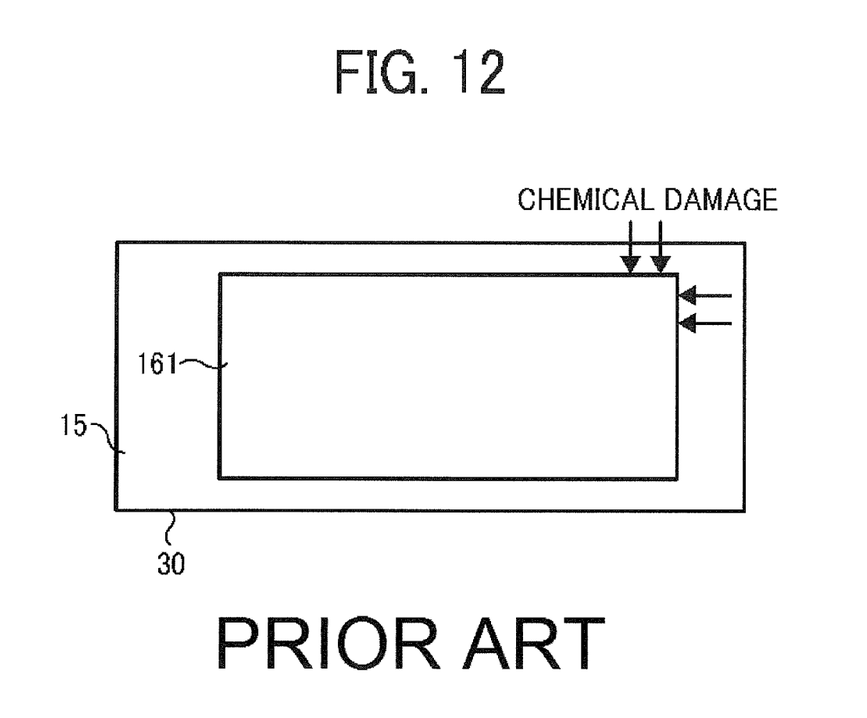
FIG. 12 illustrates the conventional lower electrode with an end corner being attacked by a chemical liquid.

The lower electrode that peels from the diaphragm during preparing the electromechanical transducer member has been observed and, the reason of which has been investigated. It was finally found out that the chemical liquid attacks the peripheral portion of the lower electrode in the resist peeling process in patterning the lower electrode. In this case, as illustrated in FIG. 12, if the corner portion of the lower electrode is angled, the chemical liquid attacks the corner from two directions in the concentrated manner, so that the chemical liquid tends to enter into the portion between the lower surface of the lower electrode and the diaphragm. When the chemical liquid enters into the portion between the lower surface of the lower electrode and the diaphragm, the lower electrode tends to peel from the diaphragm.

Accordingly, as illustrated in FIG. 6, when the corner portion of the lower electrode is shaped in a rounded shape, the chemical liquid attacks the corner portion of the lower electrode from directions along the rounded shape, and focused attack of the chemical liquid is minimized compared to the structure in which the corner portion is angled. As a result, the chemical liquid does not enter the portion between the lower surface of the lower electrode and the diaphragm, so that the lower electrode does not peel from the diaphragm. Because peeling of the lower electrode from the diaphragm is prevented, a highly reliable electromechanical transducer can be formed.

Aspect B

In Aspect A as above, curvature radius R of the rounded shaped is not less than 5 [μm]. With this structure, as described in Experiment 1, peeling of the lower electrode from the diaphragm can be optimally prevented.

Aspect C

In Aspect A or Aspect B, the peripheral portion of the lower electrode has a tapered angle relative to the diaphragm. With this structure, because the peripheral portion of the lower electrode has a tapered angle, focused attack of the chemical liquid is minimized, and the chemical liquid hardly enters into the portion between the lower surface of the lower electrode and the diaphragm. With this structure, peeling of the lower electrode from the diaphragm may be effectively prevented.

Aspect D

In Aspect C, the tapered angle θ is not more than 60 degrees. With this structure, as described in Experiment 2, peeling of the lower electrode from the diaphragm may be effectively prevented.

Aspect E

In any of Aspect A to Aspect D, an adherence layer is formed between the lower electrode and the diaphragm. With this structure, as described in the exemplary embodiments, inclusion of the adherence layer between the lower electrode and the diaphragm may improve adhesiveness between the lower electrode and the diaphragm, thereby effectively preventing the lower electrode from peeling from the diaphragm.

Aspect F

In Aspect E, the adherence layer includes titanium or Ti. With this structure, as described in the exemplary embodiments, peeling of the lower electrode from the diaphragm may be prevented effectively.

Aspect G

The liquid droplet discharge head including a liquid chamber communicating to a nozzle to discharge liquid droplets, and an electromechanical transducer including an electromechanical transducer element disposed on a substrate forming the liquid chamber and to squeeze the liquid inside the liquid chamber, in which the electromechanical transducer member as described in any one of Aspect A to Aspect F is employed.

With this structure, a reliable liquid discharge property can be obtained using the highly reliable electromechanical transducer.

Aspect H

An image forming apparatus including a liquid droplet discharge head to discharge liquid droplets to thereby form an image, the liquid droplet discharge head is the liquid droplet discharge head as described in Aspect G.

With this structure, using the liquid droplet discharge head provided with a highly reliable electromechanical transducer, formation of a highly reliable image with a reliable liquid droplet discharge property.

Additional modifications and variations of the present invention are possible in light of the above teachings. It is therefore to be understood that, within the scope of the appended claims, the invention may be practiced other than as specifically described herein.

What is claimed is:

1. An electromechanical transducer comprising:
   a substrate;
   a diaphragm formed on the substrate; and
   a piezoelectric element including:
      a lower electrode;
      a piezoelectric member; and
      an upper electrode, wherein
         a lower electrode film to form the lower electrode, a piezoelectric film to form the piezoelectric member, and an upper electrode film to form the upper electrode are laminated in a layering direction in layers on the diaphragm formed on the substrate;
         the piezoelectric element is formed such that the lower electrode film, the piezoelectric member film, and the upper electrode film are patterned to form the lower electrode, the piezoelectric member, and the upper electrode, each of which has a desired pattern; and
         in a plan view in the layering direction, corners of the lower electrode are rounded.

2. The electromechanical transducer as claimed in claim 1, further comprising an adherence layer between the lower electrode and the diaphragm.

3. The electromechanical transducer as claimed in claim 2, wherein the adherence layer comprises titanium or Ti.

4. A liquid droplet discharge head comprising:
   a plurality of nozzles to discharge liquid droplets;
   liquid chambers each to contain a liquid, and communicating to the plurality of nozzles; and
   the electromechanical transducer as claimed in claim 1, wherein the piezoelectric element is disposed on the substrate to form the liquid chambers to squeeze the liquid inside the liquid chambers.

5. An image forming apparatus comprising:
   the liquid droplet discharge head as claimed in claim 4 to discharge liquid droplets to form an image.

6. An electromechanical transducer comprising:
   a substrate;
   a diaphragm formed on the substrate; and
   a piezoelectric element including:
      a lower electrode;
      a piezoelectric member; and
      an upper electrode, wherein
         a lower electrode film to form the lower electrode, a piezoelectric film to Irwin the piezoelectric member, and an upper electrode film to form the upper electrode are laminated in layers on the diaphragm formed on the substrate;
         the piezoelectric element is formed such that the lower electrode film, the piezoelectric member film, and the upper electrode film are patterned to form the lower electrode, the piezoelectric member, and the upper electrode, each of which has a desired pattern; and
   corners of the lower electrode are rounded,
   wherein a curvature radius of the rounded corners is not less than 5 [μm].

7. The electromechanical transducer as claimed in claim 6, further comprising an adherence layer between the lower electrode and the diaphragm.

8. The electromechanical transducer as claimed in claim 7, wherein the adherence layer comprises titanium or Ti.

9. A liquid droplet discharge head comprising:
   a plurality of nozzles to discharge liquid droplets;
   liquid chambers each to contain a liquid, and communicating to the plurality of nozzles; and
   the electromechanical transducer as claimed in claim 6, wherein the piezoelectric element is disposed on the substrate to form the liquid chambers to squeeze the liquid inside the liquid chambers.

10. An image forming apparatus comprising:
    the liquid droplet discharge head as claimed in claim 9 to discharge liquid droplets to form an image.

11. An electromechanical transducer comprising:
    a substrate;
    a diaphragm formed on the substrate; and
    a piezoelectric element including:
       a lower electrode;
       a piezoelectric member; and
       an upper electrode, wherein
          a lower electrode film to form the lower electrode, a piezoelectric film to form the piezoelectric member, and an upper electrode film to form the upper electrode are laminated in layers on the diaphragm formed on the substrate;
          the piezoelectric element is formed such that the lower electrode film, the piezoelectric member film, and the upper electrode film are patterned to form the lower electrode, the piezoelectric member, and the upper electrode, each of which has a desired pattern; and
          corners of the lower electrode are rounded,
    wherein a peripheral portion of the lower electrode is tapered at an angle relative to the diaphragm.

12. The electromechanical transducer as claimed in claim 11, wherein the peripheral portion of the lower electrode is tapered at an angle relative to the diaphragm of not more than 60 degrees.

13. The electromechanical transducer as claimed in claim 11, further comprising an adherence layer between the lower electrode and the diaphragm.

14. The electromechanical transducer as claimed in claim 13, wherein the adherence layer comprises titanium or Ti.

15. A liquid droplet discharge head comprising:
   a plurality of nozzles to discharge liquid droplets;
   liquid chambers each to contain a liquid, and communicating to the plurality of nozzles; and
   the electromechanical transducer as claimed in claim 11, wherein the piezoelectric element is disposed on the substrate to form the liquid chambers to squeeze the liquid inside the liquid chambers.

16. An image forming apparatus comprising:
   the liquid droplet discharge head as claimed in claim 15 to discharge liquid droplets to form an image.

* * * * *